United States Patent
Sasagawa

(10) Patent No.: US 7,830,178 B2
(45) Date of Patent: Nov. 9, 2010

(54) DYNAMIC CIRCUIT

(75) Inventor: Yukihiro Sasagawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/699,422

(22) Filed: Jan. 30, 2007

(65) Prior Publication Data

US 2007/0176640 A1 Aug. 2, 2007

(30) Foreign Application Priority Data

Jan. 30, 2006 (JP) .............................. 2006-020964

(51) Int. Cl.
*H03K 19/096* (2006.01)
(52) U.S. Cl. .......................................... 326/97; 326/95
(58) Field of Classification Search ............. 326/93–98, 326/112, 119, 121
See application file for complete search history.

(56) References Cited

U.S. PATENT DOCUMENTS

| | | | |
|---|---|---|---|
| 5,258,666 A * | 11/1993 | Furuki | ......................... 326/106 |
| 5,389,835 A | 2/1995 | Yetter | |
| 5,402,012 A | 3/1995 | Thomas | |
| 5,483,181 A | 1/1996 | D'Souza | |
| 5,532,625 A | 7/1996 | Rajivan | |
| 5,644,753 A * | 7/1997 | Ebrahim et al. | ............. 711/131 |
| 5,825,208 A | 10/1998 | Levy et al. | |
| 6,040,716 A * | 3/2000 | Bosshart | ....................... 326/98 |
| 6,412,061 B1 * | 6/2002 | Dye | ............... 712/32 |
| 6,486,706 B2 * | 11/2002 | Ye et al. | ......................... 326/98 |
| 6,873,188 B2 * | 3/2005 | Belluomini et al. | ........... 326/98 |
| 6,876,232 B2 * | 4/2005 | Yoo | ............................ 326/98 |
| 7,221,188 B2 * | 5/2007 | Bjorksten et al. | .............. 326/95 |
| 7,282,960 B2 * | 10/2007 | Belluomini et al. | .......... 326/121 |
| 2002/0075038 A1 * | 6/2002 | Mathew et al. | ................. 326/95 |
| 2005/0083082 A1 * | 4/2005 | Olofsson | ...................... 326/95 |
| 2006/0041418 A1 * | 2/2006 | Sasagawa et al. | .............. 703/17 |

* cited by examiner

*Primary Examiner*—Rexford N Barnie
*Assistant Examiner*—Crystal L Hammond
(74) *Attorney, Agent, or Firm*—McDermott Will & Emery LLP

(57) ABSTRACT

The dynamic circuit includes: a dynamic node; an evaluation circuit for changing the charged state of the dynamic node according to a result of logic evaluation for a plurality of input signals; a control circuit for outputting a control signal of which the logic level changes according to the result of logic evaluation performed by a replica of the evaluation circuit; and an initialization circuit for receiving the control signal from the control circuit and an external control signal, to control start and stop of initialization of the dynamic node according to the control signals.

26 Claims, 11 Drawing Sheets

DYNAMIC CIRCUIT

CROSS-REFERENCE TO RELATED APPLICATIONS

This application claims priority under 35 U.S.C. §119 on Patent Application No. 2006-20964 filed in Japan on Jan. 30, 2006, the entire contents of which are hereby incorporated by reference.

BACKGROUND OF THE INVENTION

The present invention relates to a dynamic circuit, and more particularly to a technology for reducing the number of stacks of transistors constituting a dynamic circuit.

In currently available semiconductor integrated circuits, static circuits mainly represented by complementary metal oxide semiconductor (CMOS) circuits are widely used. In CMOS circuits, the output remains unchanged unless the input changes, and the current consumption is only caused by a minute leak component and an active component occurring at value transition. Thus, CMOS circuits have an advantage that the consumed current is comparatively small. As a drawback of CMOS circuits, the power delay product is comparatively large when high-speed operation is performed.

In general, a CMOS circuit has individual circuits for executing logic operation of a function of which implementation is desired, that is, an evaluation function $f$ and its complementary function $f^*$. The functions $f$ and $f^*$ are generally composed of NMOS transistors and PMOS transistors, respectively, and signals generated from the respective functions propagate to functions in the next stage, to implement circuit operation. Thus, in CMOS circuits, in which double circuits are formed for one function, the circuit scale and the signal input load are comparatively large. In particular, since PMOS transistors must have a transistor size about twice as large as NMOS transistors because of the difference in carrier mobility therebetween, the increase of the input load will be significant. This problem is not specific to CMOS circuits, but is common to static circuits as a whole including differential cascode voltage switch logic (DCVSL) and the like.

Dynamic circuits are known as having a circuit structure supplementing the drawback of the static circuits (see U.S. Pat. No. 5,532,625 (FIG. 3A), for example). In general, in dynamic circuits, a phase of initializing the output with an initialization function g and a phase of evaluating the input with a function of which implementation is desired, that is, an evaluation function $f$ operate in a time-division manner. The operations with the evaluation function $f$ and the initialization function g are respectively called evaluation operation and precharge operation. Signals are generated and propagate with the evaluation operation, and functions in the next stage perform the precharge operation and the evaluation operation, to thereby implement circuit operation. In this way, in dynamic circuits, in which only addition of an initialization function is necessary for one function, the circuit scale and the signal input load can be comparatively small. In particular, since the initialization operation is performed using a clock signal, the input load is dependent only on the evaluation function $f$ and thus is reduced to about a third of that of CMOS circuits.

To allow low-voltage operation of a dynamic circuit, it is necessary to reduce the threshold voltage of respective transistors constituting the dynamic circuit. For low leakage, however, the threshold voltage should preferably be high. Thus, since low-voltage operation and low leakage are requirements contradicting to each other, reduction in the number of stages of transistors connected in series is a requisite to attain both requirements. For this reason, with the process miniaturization, it has become difficult to implement multi-stack logic (evaluation circuit) in dynamic circuits. Also, because of occurrence of a leak, in particular, it has become very difficult to design a keeper circuit that holds the voltage of a dynamic node. To solve this problem, in some techniques, an evaluation control transistor that will otherwise be connected in series with an evaluation circuit is omitted to reduce the number of stacks, and precharge of a dynamic node is pulse-controlled to prevent unintentional flow of a through current (see U.S. Pat. No. 5,825,208 (FIG. 5), for example).

In the cases that two or more stacks exist and that an evaluation control transistor exists, noise may possibly occur with charge sharing. In particular, charge sharing is likely to occur in a domino circuit in which multiple stacks are provided to implement AND logic. Conventionally, charge sharing is suppressed by providing a circuit that supplies charge to a dynamic node (see U.S. Pat. No. 5,483,181 (FIG. 3), for example).

Dynamic circuits operate based on single-direction transition. Therefore, in a domino circuit composed of multi-staged connection of such dynamic circuits, negative logic cannot be handled in a simple way. As techniques of handling negative logic with a domino circuit, disclosed are a dual logic structure in which negative logic is produced as being in the logic duality relationship with positive logic (see U.S. Pat. No. 5,389,835 (FIG. 1), for example) and an inverted logic structure in which negative logic is produced forcefully by inverting the output of a dynamic circuit (see U.S. Pat. No. 5,402,012 (FIG. 1), for example).

As described above, the number of stacks increases with the existence of an evaluation control transistor and this is likely to cause charge sharing. The technology for reducing charge sharing described above will raise another problem of increasing the circuit scale.

The provision of an evaluation control transistor also causes a problem as follows, in addition to the increase in the number of stacks. Assuming an evaluation circuit composed of transistors connected in parallel, for example, if one of the transistors is ON, a capacitance formed between this transistor and an evaluation control transistor will be added redundantly as a parasitic capacitance of a dynamic node, causing a redundant current to flow during precharge operation and during evaluation operation.

In the technique of performing pulse-controlled precharge for the purpose of omitting the evaluation control transistor, it is necessary to secure the pulse width responsive to the operation conditions and the capacitance of the dynamic node. In particular, when the pulse width is to be secured using a delay buffer, a margin of a sufficiently large delay amount must be given to ensure precharge even in the worst conditions. This will however increase the overhead of the circuit.

The time required from start of precharge until the voltage of a dynamic node reaches a predetermined level depends on the drive capability of a precharge circuit and the capacitance of the dynamic node. More specifically, precharge will be completed comparatively fast if the drive capability of the precharge circuit is high or the capacitance of the dynamic node is small, while the time required until completion of precharge will be comparatively long if the drive capability of the precharge circuit is low or the capacitance of the dynamic node is large. In general, the capacitance of a dynamic node varies because the dynamic node has a parasitic capacitance typified by a wiring capacitance and a transistor source-drain capacitance. Also, the drive capability of a precharge circuit varies. In view of this, it is difficult to determine an optimal pulse width in the pulse-controlled precharge. With an unnecessarily long pulse width, a through current will flow if a logic condition is satisfied during the precharge.

In the handling of negative logic in a domino circuit described above, in the case of the dual logic structure, in which both positive logic and negative logic are implemented with single-direction transition-based signals, no erroneous operation will occur even if precharge is started prior to finalization of an input signal. In other words, in the dual logic structure, the circuit operates based on the evaluation operation, and thus the constraint between the timing of start of precharge and the timing of finalization of an input signal is comparatively relaxed. However, the dual logic structure has the following drawbacks.

The circuit scale will increase because it is necessary to provide two evaluation circuits that are in the logic duality relationship with each other. Also, one of the two evaluation circuits will be AND logic without fail, requiring serial connection of a plurality of transistors. In the dual logic structure, therefore, the problem of multiple stacks is left unsolved. For example, in implementation of 5-input OR logic, 5-input AND logic will be necessary as the dual logic thereof. In particular, if the number of stacks is limited by the circuit structure, it will be difficult to configure multi-input AND logic.

Meanwhile, in the case of the inverted logic structure, in which negative logic is obtained simply by inverting the output of a dynamic circuit, the problem of increasing the circuit scale is solved. However, to guarantee the dual-direction transition-based operation, it must be ensured that precharge should be completed prior to finalization of the input signal. To attain this, an evaluation control transistor is a requisite. Thus, in the inverted logic structure, the constraint between the timing of start of precharge and the timing of finalization of an input signal is very strict. More specifically, the time allocatable to setups and logic propagation will be the remainder left after subtracting a clock skew margin from the period of a clock signal for precharge control. In other words, the logic propagation time allowed in one cycle will be reduced due to a clock skew. In particular, in high-frequency operation, in which while the clock period becomes short, it is still difficult to reduce the clock skew, high-speed implementation will be difficult. Also, serial connection of transistors will still be required to implement multi-input AND logic, and thus the problem of multiple stacks is yet to be solved.

SUMMARY OF THE INVENTION

An object of the present invention is providing a dynamic circuit in which the number of stacks of transistors is reduced by omitting an evaluation control transistor and flow of a through current during initialization operation that may occur along with the omission of the evaluation control transistor is suppressed. Another object of the present invention is providing a dynamic circuit in which the timing constraint between initialization of a dynamic node and evaluation of an input signal is relaxed.

The dynamic circuit of the present invention includes: a chargeable dynamic node; an evaluation circuit for performing logic evaluation for a plurality of input signals and changing the charged state of the dynamic node based on an evaluation result; a control circuit having a replica circuit of at least part of the evaluation circuit and outputting a first control signal of which the logic level changes according to a result of logic evaluation for at least part of the plurality of input signals performed by the replica circuit; and an initialization circuit for receiving the first control signal from the control circuit and a second control signal from outside, and starting initialization of the dynamic node if the second control signal shifts from a first logic level to a second logic level and stopping the initialization of the dynamic node if the first control signal shifts from a first logic level to a second logic level.

According to the dynamic circuit described above, the initialization of the dynamic node is stopped midway if a predetermined logic condition for at least part of the plurality of input signals is satisfied. If the condition is not satisfied, the initialization can be completed. Thus, unintentional flow of a through current can be prevented during the operation of initializing the dynamic node without the necessity of providing an evaluation control transistor. Also, with no evaluation control transistor provided, the number of stacks of transistors can be reduced, and the charge sharing can be suppressed. Moreover, since a slight amount of time allowance is given from the start of the initialization of the dynamic node until the stop thereof, the timing constraint between the operation of initializing the dynamic node and the operation of evaluating the input signals can be relaxed.

Preferably, the replica circuit has the same logic structure and input as the entire of the evaluation circuit.

Specifically, the initialization circuit may include: a first switch circuit connected to either one of a node for supplying an initializing voltage for the dynamic node and the dynamic node at one terminal, the first switch circuit being turned ON if the second control signal shifts to its second logic level; and a second switch circuit connected to the other terminal of the first switch circuit at one terminal and to the other of the two nodes at the other terminal, the second switch circuit being turned OFF if the first control signal shifts to its second logic level.

Alternatively, specifically, the initialization circuit may include: a logic operation circuit for receiving the first and second control signals and performing logic operation for these signals; and a switch circuit connected to a node for supplying an initializing voltage for the dynamic node at one terminal and to the dynamic node at the other terminal, the switch circuit switching between ON/OFF of electrical connection between these nodes according to an output of the logic operation circuit.

Specifically, the control circuit may receive the second control signal, and set the first control signal at its second logic level if the second control signal is in its second logic level and the result of logic evaluation performed by the replica circuit is truth, and otherwise set the first control signal at its first logic level.

More specifically, the control circuit may include: a first switch circuit connected to a voltage node corresponding to the second logic level of the first control signal at one terminal and to one terminal of the replica circuit at the other terminal, the first switch circuit receiving the second control signal and being turned ON if the second control signal shifts to its second logic level; and a second switch circuit connected to a voltage node corresponding to the first logic level of the first control signal at one terminal and to an output node of the first control signal, the second switch circuit receiving the second control signal and being turned ON if the second control signal shifts to its first logic level, and the other terminal of the replica circuit may be connected to the output node of the first control signal.

Preferably, the control circuit receives the second control signal and a voltage of the dynamic node, and sets the first control signal at its second logic level if the second control signal is in its second logic level and either the result of logic evaluation performed by the replica circuit is truth or the voltage of the dynamic node is equal to or higher than a predetermined level, and otherwise sets the first control signal at its first logic level. With this setting, the initialization of the dynamic node can be performed adaptively according to the drive capability of the initialization circuit and the capacitance of the dynamic node.

Specifically, the control circuit may include: a first switch circuit connected to a voltage node corresponding to the second logic level of the first control signal at one terminal and to one terminal of the replica circuit at the other terminal, the first switch circuit receiving the second control signal and being turned ON if the second control signal shifts to its second logic level; a second switch circuit connected to either one of a voltage node corresponding to the first logic level of the first control signal and an output node of the first control signal at one terminal, the second switch circuit receiving the second control signal and being turned ON if the second control signal shifts to its first logic level; a third switch circuit connected to the other terminal of the second switch circuit and to the other of the voltage node corresponding to the first logic level of the first control signal and the output node of the first control signal at the other terminal, the third switch circuit being ON until the voltage of the dynamic node reaches the predetermined level; and a fourth switch circuit connected in parallel with at least the replica circuit and turned ON once the voltage of the dynamic node reaches the predetermined level, and the other terminal of the replica circuit may be connected to the output node of the first control signal.

Preferably, the dynamic circuit further includes a constant current source connected in series with the evaluation circuit. With this provision, the change of the charged state of the dynamic node observed when the evaluation circuit is ON can be made constant irrespective of the logic structure of the evaluation circuit.

Preferably, transistors constituting the replica circuit and transistors constituting the corresponding at least part of the evaluation circuit are configured in pairs, and signal input terminals of the replica circuit and the corresponding at least part of the evaluation circuit are placed between the respective paired transistors.

Preferably, the evaluation circuit has a plurality of transistors respectively provided for the plurality of input signals for switching between ON/OFF according to the corresponding input signals, and the plurality of transistors are connected in parallel.

Alternatively, the dynamic circuit of the present invention includes: a chargeable dynamic node; an initialization circuit for initializing the dynamic node; and an evaluation circuit for performing logic evaluation for a plurality of input signals and changing the charged state of the dynamic node according to an evaluation result, wherein the evaluation circuit has a plurality of transistors respectively provided for the plurality of input signals for switching between ON/OFF according to the corresponding input signals, and the plurality of transistors are connected in parallel. With this configuration, the number of stacks of transistors in the dynamic circuit can be reduced.

The method for initializing a dynamic circuit of the present invention includes the steps of: starting initialization of a dynamic node under a predetermined condition; performing logic evaluation for at least part of a plurality of input signals; and stopping the initialization of the dynamic node if a result of the logic evaluation is true. With this method, in a dynamic circuit, the initialization of the dynamic node is stopped midway if a predetermined logic condition is satisfied for at least part of the plurality of input signals. If the condition is not satisfied, the initialization can be completed. Thus, in a dynamic circuit having no evaluation control transistor, unintentional flow of a through current can be prevented during the operation of initializing the dynamic node. Also, with no evaluation control transistor provided, the number of stacks of transistors can be reduced, and the charge sharing can be suppressed. Moreover, since a slight amount of time allowance is given from the start of the initialization of the dynamic node until the stop thereof, the timing constraint between the operation of initializing the dynamic node and the operation of evaluating the input signals can be relaxed.

Preferably, in the method for initializing a dynamic circuit described above, the initialization of the dynamic node is continued until the voltage of the dynamic node reaches a predetermined level if the result of the logic evaluation is false, and is stopped once the voltage of the dynamic node reaches the predetermined level. With this method, the initialization of the dynamic node can be performed adaptively according to the drive capability of initializing the dynamic node and the capacitance of the dynamic node.

BRIEF DESCRIPTION OF THE DRAWINGS

FIG. 12 is a layout of transistors constituting the dynamic circuit of FIG. 10 and the like.

DESCRIPTION OF THE PREFERRED EMBODIMENTS

Hereinafter, preferred embodiments of the present invention will be described with reference to the accompanying drawings.

Embodiment 1

Figure 1:
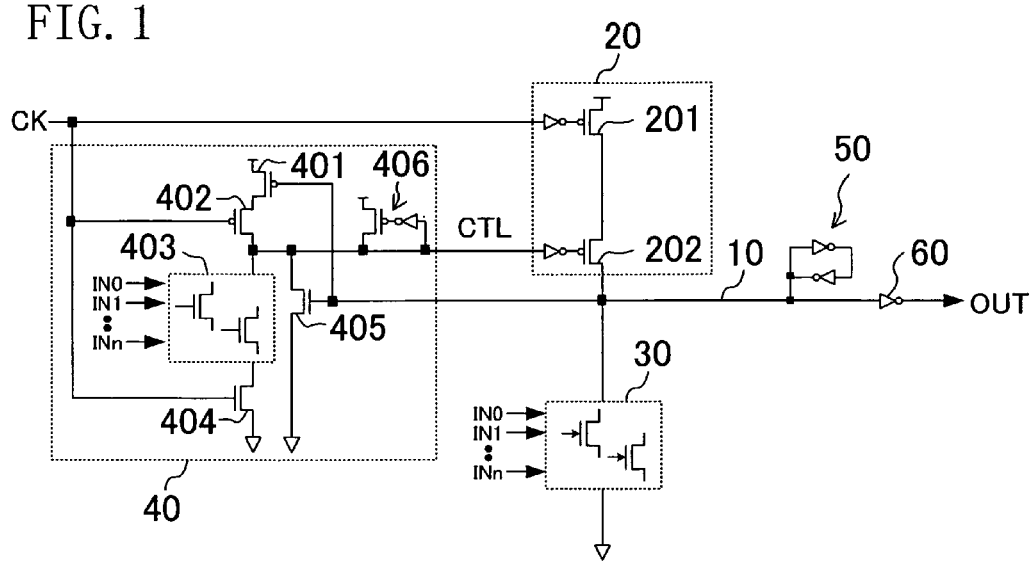
FIG. 1 is a block diagram of a dynamic circuit of Embodiment 1.

FIG. 1 shows a configuration of a dynamic circuit of Embodiment 1. The dynamic circuit of this embodiment includes a dynamic node 10, an initialization circuit 20, an evaluation circuit 30 and a control circuit 40. The dynamic node 10 is precharged (initialized) with the initialization circuit 20 and discharged with a discharge path that may be formed in the evaluation circuit 30. The voltage of the dynamic node 10 is logically inverted with an inverter 60, and the inverted voltage is outputted as an output signal OUT of the dynamic circuit. A keeper circuit 50 may be provided as required to hold the voltage of the dynamic node 10.

The evaluation circuit 30 performs given logic evaluation for a plurality of input signals IN0 to INn (hereinafter, these signals may sometimes be referred to as an input signal IN collectively). The evaluation circuit 30, connected between the dynamic node 10 and the ground node, constitutes a discharge pass for the dynamic node 10 once a predetermined logic condition for the input signal IN is satisfied. In other words, the output signal OUT goes high (Hi) if the result of the logic evaluation with the evaluation circuit 30 is truth, and goes low (Lo) if it is false.

The initialization circuit 20 receives a control signal CTL supplied from the control circuit 40 and a clock signal CK supplied from outside, and controls precharge of the dynamic node 10 according to the received signals. To state more specifically, the initialization circuit 20 includes serially connected PMOS transistors 201 and 202. The PMOS transistor 201 is connected to a power supply voltage node at its source and receives an inverted signal of the clock signal CK at its gate. The PMOS transistor 202 is connected to the dynamic node 10 at its drain and receives an inverted signal of the control signal CTL at its gate. Note that the PMOS transistors 201 and 202 may be connected in reverse order to that described above.

The control circuit 40 receives the clock signal CK and the voltage of the dynamic node 10, and generates the control signal CTL based on the received signals. To state more specifically, the control circuit 40 includes serially connected PMOS transistors 401 and 402, a replica circuit 403 and NMOS transistors 404 and 405. The PMOS transistor 401 is connected to the power supply voltage node at its source and receives the voltage of the dynamic node 10 at its gate. The PMOS transistor 402 is connected to an output node of the control signal CTL at its drain and receives the clock signal CK at its gate. Note that the PMOS transistors 401 and 402 may be connected in reverse order to that described above. The replica circuit 403, which is a replica of the entire of the evaluation circuit 30, is connected to the output node of the control signal CTL. The NMOS transistor 404, connected in series with the replica circuit 403, is connected to the ground node at its source and receives the clock signal CK at its gate. The NMOS transistor 405 is placed between the output node of the control signal CTL and the ground node, and receives the voltage of the dynamic node 10 at its gate.

A keeper circuit 406 may be provided as required to hold the voltage of the control signal CTL. The drain of the NMOS transistor 405 may be connected, not to the ground node, but to a connection point between the replica circuit 403 and the NMOS transistor 404.

Figure 2:
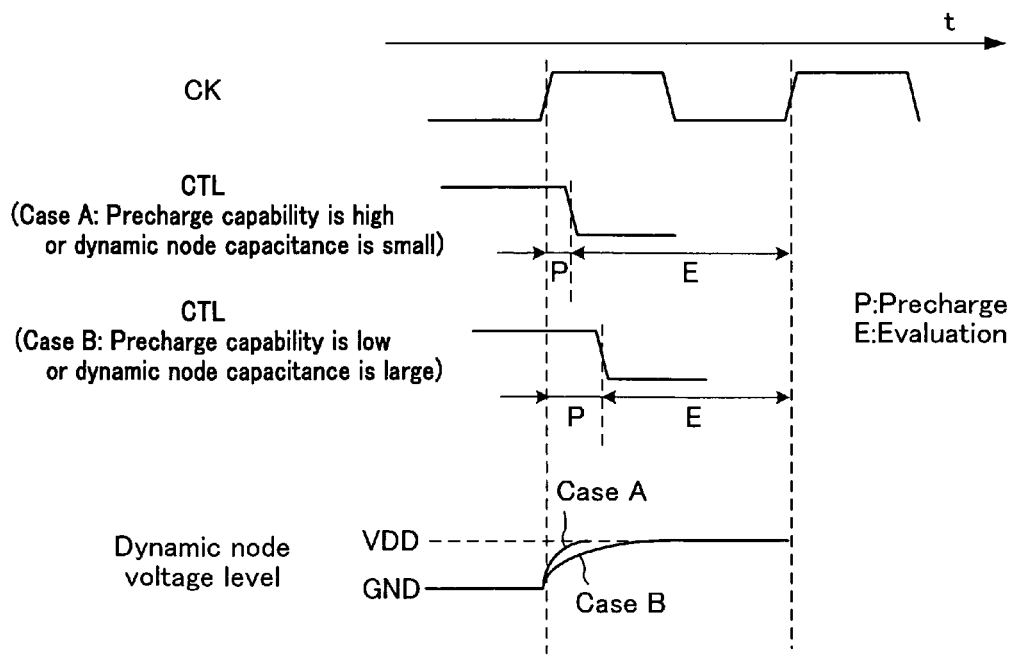
FIG. 2 is a timing chart illustrating adaptive precharge control performed with the dynamic circuit of FIG. 1.

Adaptive precharge control with the dynamic circuit of this embodiment will be described with reference to the timing chart of FIG. 2. When the clock signal CK shifts the level from Lo to Hi, the NMOS transistor 404 is turned ON. At this time, if a predetermined logic condition is not satisfied in the replica circuit 403, the replica circuit 403 is OFF, allowing the control signal CTL to keep the Hi level. Thus, with both the PMOS transistors 201 and 202 being ON, precharge of the dynamic node 10 is started. The precharge is stopped once the NMOS transistor 405 is turned ON. The NMOS transistor 405 will be turned ON if the voltage of the dynamic node 10 exceeds a threshold voltage Vth. The voltage of the dynamic node 10 will reach the threshold voltage Vth in a comparatively short time if the drive capability of the initialization circuit 20 is comparatively high or the capacitance of the dynamic node 10 is comparatively small (case A in FIG. 2). Contrarily, a comparatively long time will be required until the voltage of the dynamic node 10 reaches the threshold voltage Vth if the drive capability of the initialization circuit 20 is comparatively low or the capacitance of the dynamic node 10 is comparatively large (case B in FIG. 2). In this way, precharge control is performed adaptively according to the drive capability of the initialization circuit 20 and the capacitance of the dynamic node 10.

Figure 3:
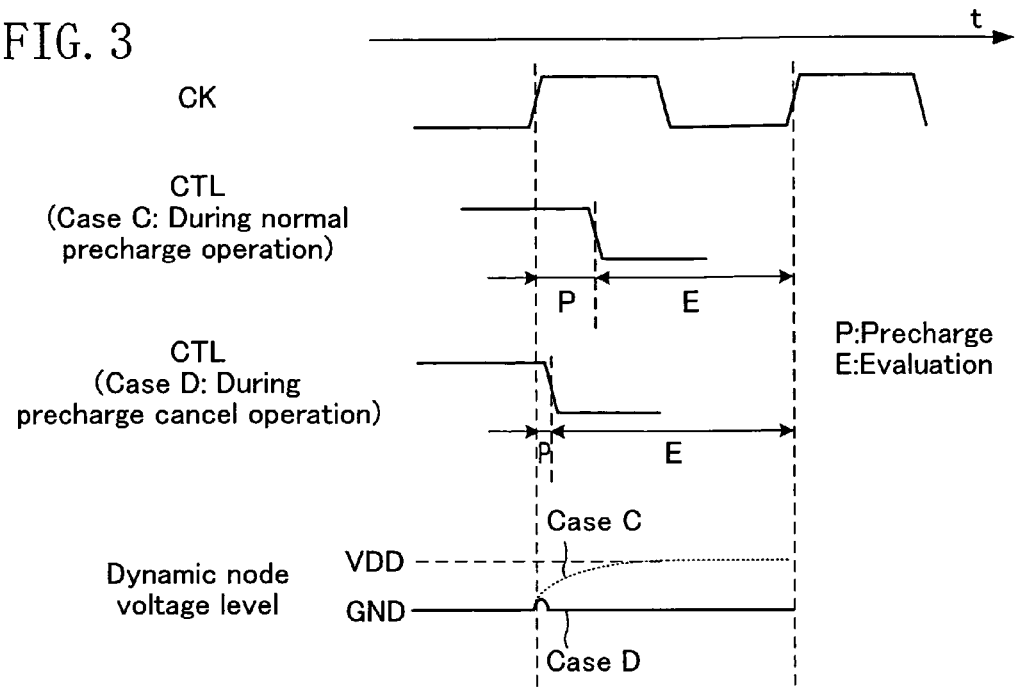
FIG. 3 is a timing chart illustrating suppression of a through current performed with the dynamic circuit of FIG. 1.

Next, suppression of a through current with the dynamic circuit of this embodiment will be described with reference to the timing chart of FIG. 3. When the clock signal CK shifts its level from Lo to Hi, precharge is started. Thereafter, the replica circuit 403 may be turned ON (if the evaluation result is truth) or OFF (if it is false) depending on the state of the input signal IN. If the evaluation result is false (case C in FIG. 3), the replica circuit 403 is OFF, allowing the adaptive precharge to be performed with the NMOS transistor 405 as described above (normal precharge operation). On the contrary, if the evaluation result is truth (case D in FIG. 3), the replica circuit 403 is turned ON. Immediately after this turning ON, the control signal CTL goes Lo, stopping the precharge (precharge cancel operation). When the replica circuit 403 is turned ON, the evaluation circuit 30 is also turned ON, putting the dynamic node 10 in electrical connection with the ground node. However, since the precharge is stopped midway with the replica circuit 403 becoming ON, no through current will flow.

Figure 4:
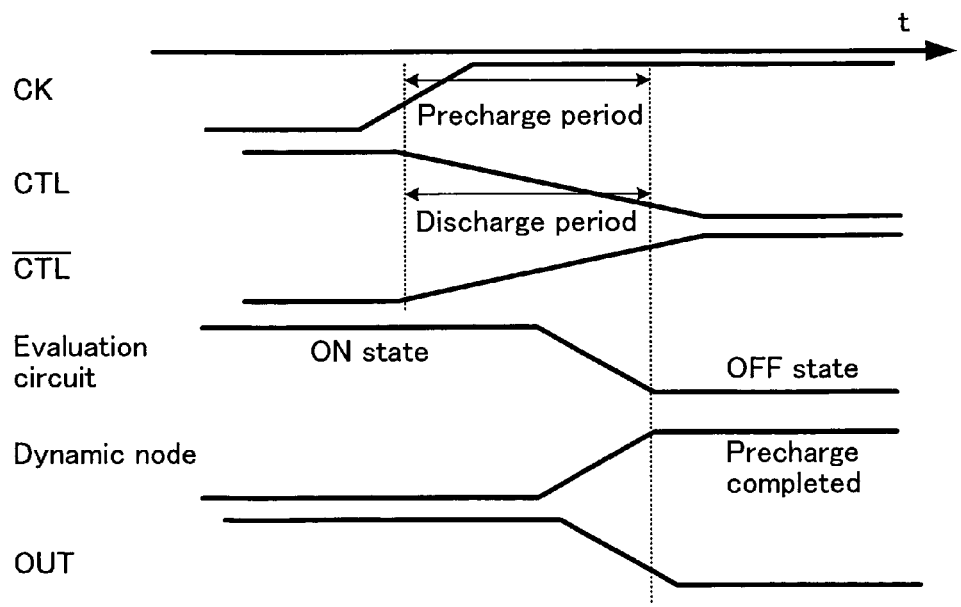
FIG. 4 is a timing chart illustrating precharge cancel operation performed with the dynamic circuit of FIG. 1.

The precharge cancel operation will be described in more detail with reference to FIG. 4. Along with the shift of the clock signal CK to the Hi level, precharge of the dynamic node 10 is started. At this time, if the evaluation circuit 30 is ON, the replica circuit 403 is also ON, allowing discharge of the output node of the control signal CTL to be started. Once the discharge of the output node of the control signal CTL is completed, at which the control signal CTL is in the Lo level, the precharge of the dynamic node 10 is stopped. In other words, the precharge period for the dynamic node 10 in the precharge cancel operation is equal to the discharge period for the output node of the control signal CTL, and this corresponds to the delay time in the replica circuit 403.

As the replica circuit 403 is the same in logic structure as the evaluation circuit 30, the delay time in the replica circuit 403 is substantially the same as that in the evaluation circuit 30. It can therefore be said that the precharge period corresponds to the delay time in the evaluation circuit 30. For this reason, even if precharge is started while the evaluation circuit 30 is still ON, although it should have been turned OFF, because of delay of finalization of the input signal IN, the precharge of the dynamic node 10 will be completed if the input signal IN is finalized within the time corresponding to the delay time in the evaluation circuit 30 and this turns OFF the evaluation circuit 30. In other words, a correct evaluation result can be obtained as long as the input signal IN is finalized within the equivalent of the delay time in the evaluation circuit 30 from the start of the precharge even though the input signal IN is based on dual-direction transition. Hence, the constraint between the timing of start of precharge and the timing of finalization of the input signal IN, which has been a drawback of the inverted logic structure, is relaxed.

Figure 5A:
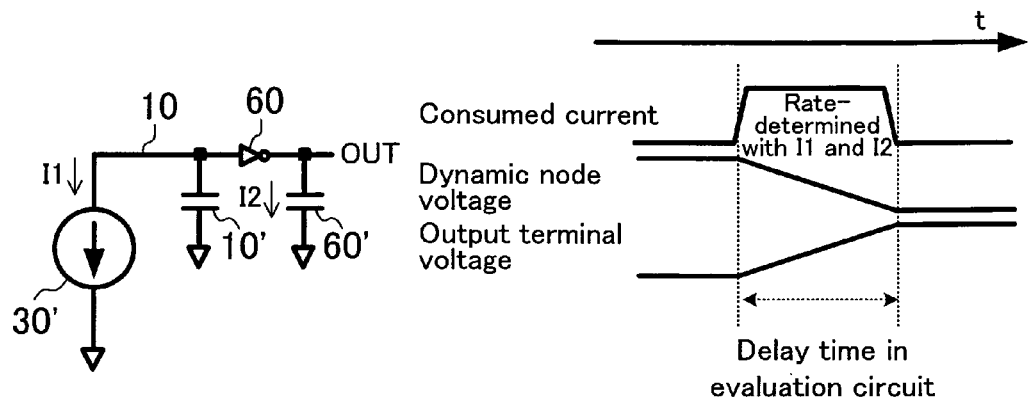
FIGS. 5A and 5B are model diagrams illustrating current consumption related to discharge of a dynamic node in FIG. 1.

Next, referring to FIGS. 5A and 5B, the current consumption related to the discharge of the dynamic node 10 will be discussed by comparing those during the normal operation and during the precharge cancel operation. FIG. 5A illustrates a current consumption model during the normal operation. During the normal operation, while charge stored in a parasitic capacitance 10' (corresponding to the dynamic node 10) is discharged with a current source 30' (corresponding to the evaluation circuit 30 in the ON state), a capacitance 60' (corresponding to the output load of the inverter 60) is charged with the inverter 60. Accordingly, during the normal operation, a current that is rate-determined with a current I1 flowing to the current source 30' (corresponding to a saturation current flowing to the evaluation circuit 30 in the ON state) and a saturation current I2 flowing to the inverter 60 within the delay time in the evaluation circuit 30 is consumed.

Figure 5B:
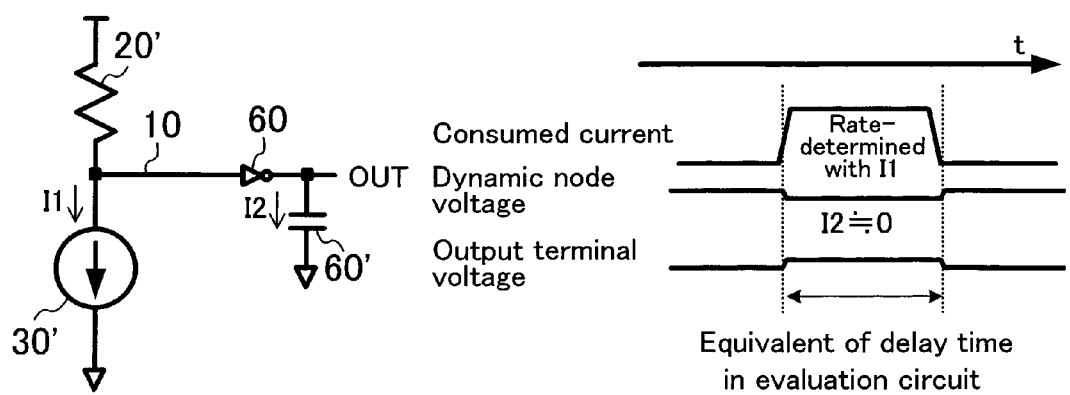

FIG. 5B illustrates a current consumption model during the precharge cancel operation. During the precharge cancel operation, while a current flowing to a resistance 20' (corresponding to the initialization circuit 20 under precharge control) is discharged with the current source 30', the capacitance 60' is charged with the inverter 60. Since the output of the inverter 60 seldom changes, a consumed current I2 in the inverter 60 is roughly zero. Accordingly, during the precharge cancel operation, a current that is rate-determined with the current I1 flowing to the current source 30' within the equivalent of the delay time in the evaluation circuit 30 is consumed. Thus, the consumed current during the precharge cancel operation is roughly the same as the consumed current during the normal operation. In other words, although a slight amount of current flows during the precharge cancel operation, the magnitude of this flow is too small to raise a problem.

Figure 6A:
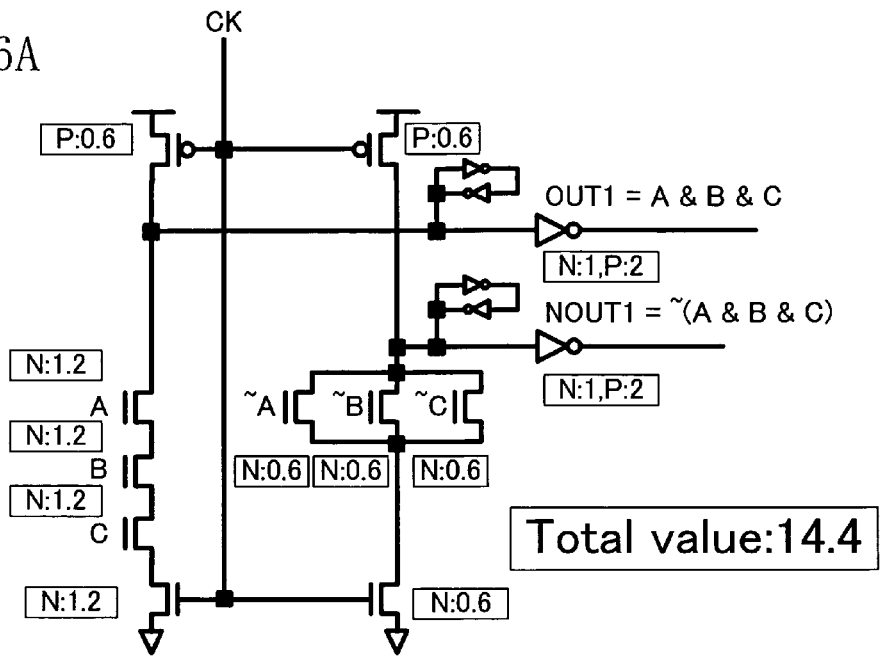
FIGS. 6A and 6B are views illustrating an effect of circuit scale reduction attained with the dynamic circuit of FIG. 1.
Figure 6B:
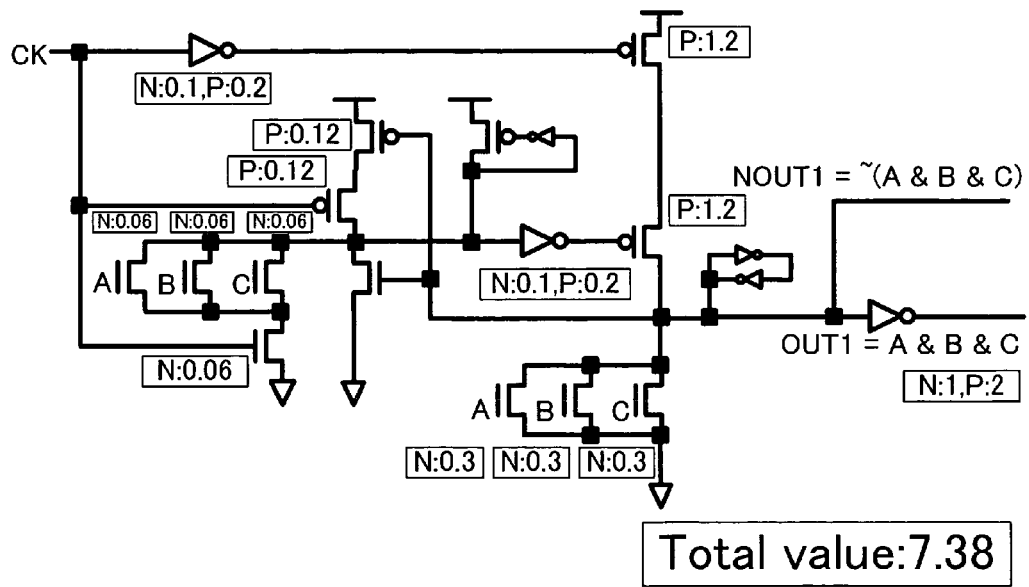

An effect of the circuit scale reduction with the dynamic circuit of this embodiment will be described with reference to FIGS. 6A and 6B. FIGS. 6A and 6B represent a dynamic circuit based on the dual logic structure and a dynamic circuit of the present invention, respectively, in relation to 3-input AND logic. In both dynamic circuits, the sizes of transistors and inverters have been calculated assuming that the output drive capability is the same, the stepping ratio (fan-out allowed to drive the next stage) is "3", the capability ratio of PMOS transistors to NMOS transistors is "1:2", and the size of an output-stage NMOS transistor is "1". The transistor sizes are shown in the respective blocks in FIGS. 6A and 6B. A replica is sized one-tenth its original. In comparison of the transistor size total value between the two dynamic circuits, while it is "14.1" in the dynamic circuit based on the dual logic structure, it is "7.38", about the half of "14.1" in the dynamic circuit of the present invention. In the dual logic structure, two evaluation circuits in the logic duality relationship must be provided, and this increases the circuit scale. On the contrary, in the dynamic circuit of the present invention, although the replica circuit 403 having the same logic structure as the evaluation circuit 30 must be provided, the size thereof can only be one-tenth that of the evaluation circuit 30. As a whole, therefore, the circuit scale can be significantly reduced compared with the dual logic structure.

Thus, in this embodiment, since no evaluation control transistor is necessary, the number of stacks of transistors can be reduced. Also, the timing constraint between the operation of initializing the dynamic node and the operation of evaluating the input signal is relaxed, and thus a through current that may otherwise flow during the operation of initializing the dynamic node can be suppressed. Moreover, with this relaxation of the timing restraint, a domino circuit based on the inverted logic structure can be easily implemented. This makes it possible to reduce the increase of the circuit scale and also reduce the number of stacks in the domino circuit.

The replica circuit 403 is not necessarily the entire replica of the evaluation circuit 30, but may be a replica of part of the evaluation circuit 30. For example, if the result of the logic evaluation of the evaluation circuit 30 depends on the result of logic evaluation on part of the input signal IN, the precharge stop control can be performed correctly according to the result of logic evaluation by a relevant partial replica.

Figure 7:
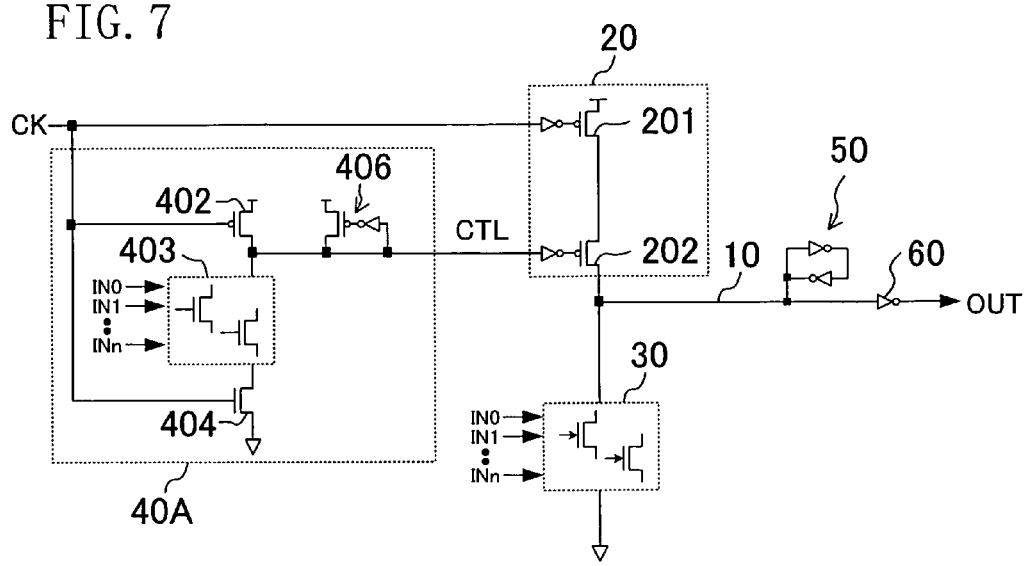
FIG. 7 is a block diagram of a dynamic circuit omitting the adaptive precharge control.

The adaptive precharge control may not be performed. The dynamic circuit in this case will be configured to have a control circuit 40A shown in FIG. 7, for example. The control circuit 40A omits the PMOS transistor 401 and the NMOS transistor 405 from the configuration of the control circuit 40 in FIG. 1. Without the adaptive precharge control, the effects such as the reduction in the number of stacks and the relaxation of the timing constraint will not be lost at all.

Embodiment 2

Figure 8:
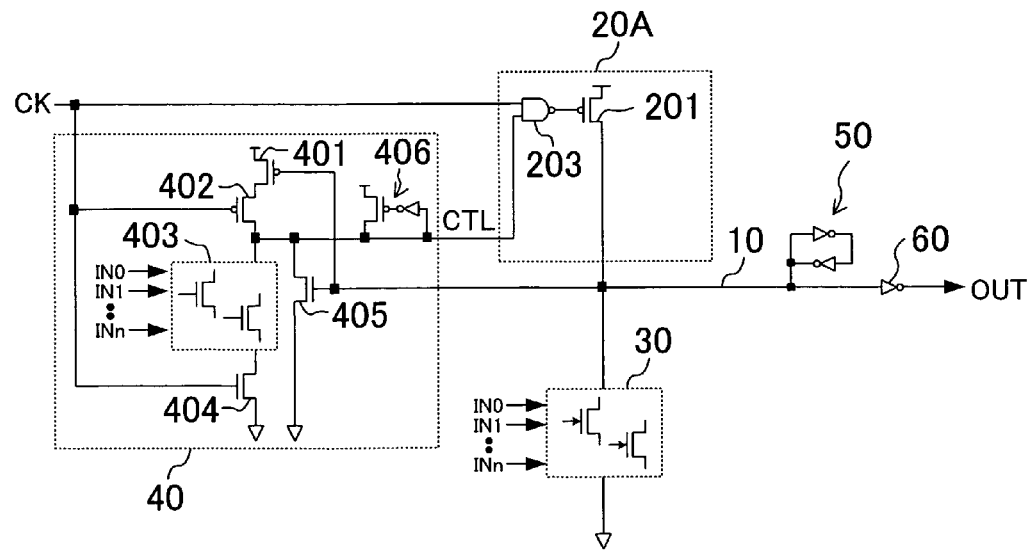
FIG. 8 is a block diagram of a dynamic circuit of Embodiment 2.

FIG. 8 shows a configuration of a dynamic circuit of Embodiment 2. The dynamic circuit of this embodiment has an initialization circuit 20A in place of the initialization circuit 20 in the dynamic circuit of FIG. 1. In the initialization circuit 20A, the PMOS transistor 202 in the initialization circuit 20 is omitted and a NAND gate 203 is newly provided. The NAND gate 203 receives the clock signal CK and the control signal CTL and outputs the computation result to the PMOS transistor 201.

Thus, in this embodiment, the number of stacks of transistors can be further reduced.

Embodiment 3

Figure 9:
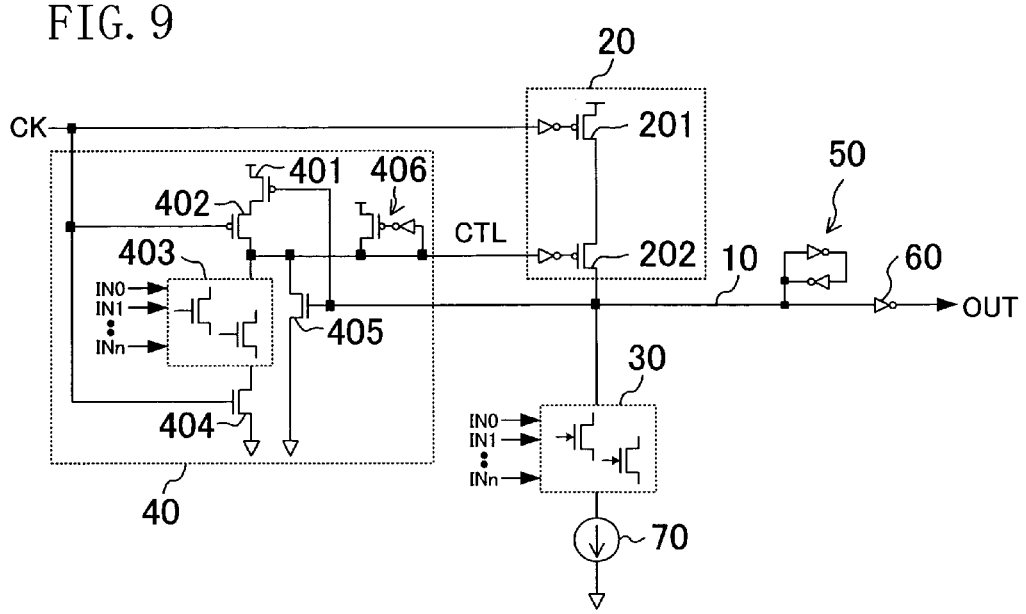
FIG. 9 is a block diagram of a dynamic circuit of Embodiment 3.

FIG. 9 shows a configuration of a dynamic circuit of Embodiment 3. The dynamic circuit of this embodiment has a constant current source 70 in addition to the components of the dynamic circuit of FIG. 1. The constant current source 70 is placed between the evaluation circuit 30 and the ground node. Specifically, the constant current source 70 can be composed of a transistor receiving a predetermined voltage at its gate.

When the evaluation circuit 30 is composed of a plurality of parallel-connected transistors, for example, the delay time in the evaluation circuit 30 varies with the number of transistors that are ON among these transistors, and as a result, the discharge speed of the dynamic node 10 changes. To overcome this problem, the constant current source 70 is inserted in serial connection with the evaluation circuit 30, and the current amount of the constant current source 70 is made equal to the saturation current amount of one transistor in the evaluation circuit 30. With this configuration, the discharge current can be constant irrespective of whether or not a plurality of transistors are ON. In other words, the discharge speed of the dynamic node 10 can be kept constant. Also, by making the discharge current constant, the degree of effect of noise that may be applied to inputs of the evaluation circuit 30 can be made constant irrespective of whether or not noise has been applied to a plurality of transistors. This produces the effect of fixing the noise margin.

The constant current source 70 may otherwise be placed between the dynamic node 10 and the evaluation circuit 30. With this alteration, also, the discharge speed at the dynamic node 10 can be kept constant. Preferably, however, the constant current source 70 should be placed between the evaluation circuit 30 and the ground node. With this placement, a node between the evaluation circuit 30 and the constant current source 70 will substantially have a ground potential, and this can prevent increase in parasitic capacitance that may occur with increase in the number of stacks.

Embodiment 4

Figure 10:
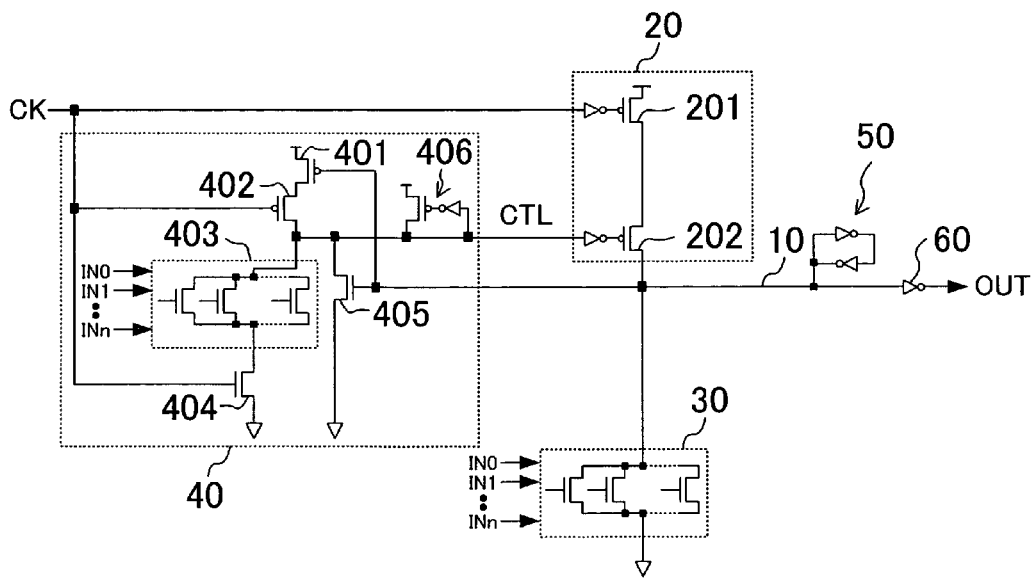
FIG. 10 is a block diagram of a dynamic circuit of Embodiment 4.

FIG. 10 shows a configuration of a dynamic circuit of Embodiment 4. The dynamic circuit of this embodiment is basically the same as the dynamic circuit of FIG. 1 except that in the evaluation circuit 30, transistors corresponding to the respective input signals IN are connected in parallel, and to coincide with this, the replica circuit 403 also has transistors connected in parallel.

To reduce the number of stacks of transistors, it is preferred not to have AND logic in the evaluation circuit 30. Given AND logic can be dual-transformed to combination logic of OR logic and negation logic. The evaluation circuit 30 in the dynamic circuit of this embodiment is formed as OR logic. Therefore, by connecting such dynamic circuits of this embodiment in multiple stages and inputting the output, or inversion of the output, of the preceding dynamic circuit to the parallel-connected transistors of the evaluation circuit 30 appropriately, given logic composed of a combination of OR logic and negation logic can be formed.

Figure 11A:
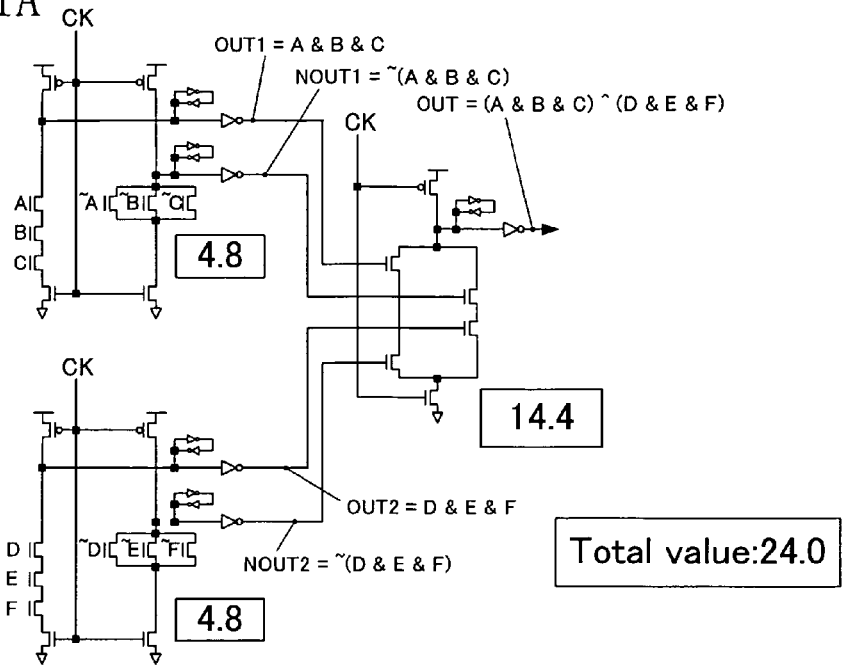
FIGS. 11A and 11B are views illustrating an effect of circuit scale reduction attained with the dynamic circuit of FIG. 10.
Figure 11B:
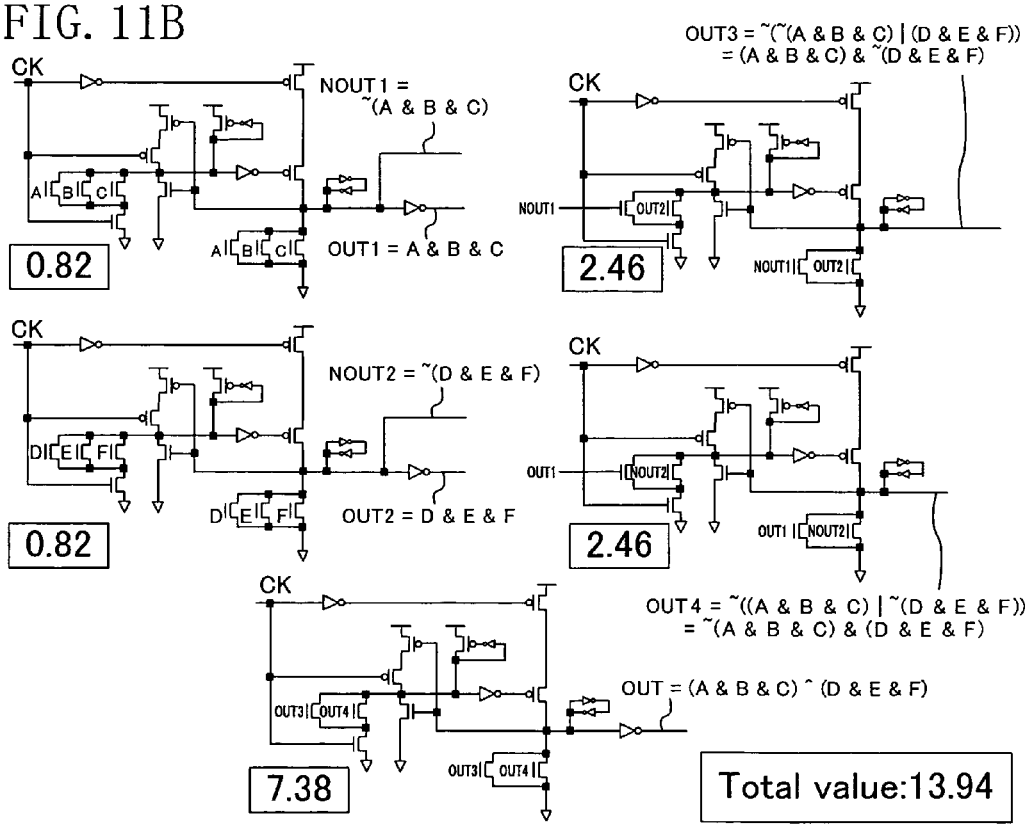

An effect of the circuit scale reduction with the dynamic circuit of this embodiment will be described with reference to FIGS. 11A and 11B. FIGS. 11A and 11B represent a dynamic circuit based on the dual logic structure and a dynamic circuit of the present invention, respectively, in relation to exclusive OR between two 3-input AND logic circuits "A&B&C" and "D&E&F". In both dynamic circuits, the sizes of transistors and inverters have been calculated assuming that the output drive capability is the same, the stepping ratio (fan-out allowed to drive the next stage) is "3", the capability ratio of PMOS transistors to NMOS transistors is "1:2", and the size of an output-stage NMOS transistor is "1". The transistor sizes are shown in the respective blocks in FIGS. 11A and 11B. In comparison of the transistor size total value between the two dynamic circuits, while it is "24.0" in the dynamic circuit based on the dual logic structure, it is "13.94" in the dynamic circuit of the present invention. Thus, as described above, the circuit scale can be significantly reduced in the dynamic circuit of this embodiment compared with the dual logic structure.

While the dual logic structure is configured in two stages, the dynamic circuit of this embodiment is configured in three stages. However, since all of the evaluation circuits 30 in the dynamic circuits of this embodiment are composed of parallel-connected transistors, the individual response speed is fast. Thus, even though the number of connected stages is greater than that of the dual logic structure, the final output can be obtained at an equal or even higher response speed as a whole.

Thus, in this embodiment, the number of stacks of transistors can be further reduced. Also, with the omission of the evaluation control transistor and the reduction of the number of stacks to one stage in the evaluation circuit, a parasitic capacitance will less likely to be formed between the dynamic node and the evaluation circuit, and this can suppress occurrence of charge sharing at the dynamic node. This can also suppress flow of an excessive current that may occur due to a parasitic capacitance during the precharge operation and the evaluation operation.

(Layout of Dynamic Circuit)

As shown in FIG. 10 and the like, the evaluation circuit 30 in the dynamic circuit of the present invention is composed of NMOS transistors. In this relation, at the time of layout of the inventive dynamic circuit, if the layout method for CMOS cells that is based on the premise that PMOS transistors and NMOS transistors are the same in number is adopted as it is, the gate electrode length will be long and this will disadvantageously increase the input capacitance of the cells. It is therefore desirable to adopt an optimal layout method for the inventive dynamic circuit. Hereinafter, a layout suitable for the inventive dynamic circuit will be described.

Figure 12:
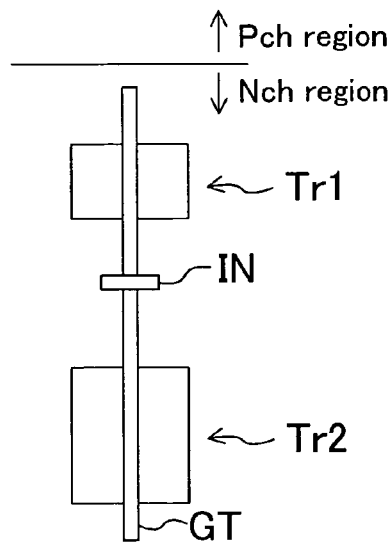

FIG. 12 shows a layout of transistors constituting the dynamic circuit of FIG. 10 and the like. An NMOS transistor Tr1 included in the evaluation circuit 30 and an NMOS transistor Tr2 included in the replica circuit 403 are configured as a pair, connected via one gate electrode GT. These transistors Tr1 and Tr2 are laid out to extend vertically with respect to the boundary between a Pch region and an Nch region. An input terminal IN is provided at a position on the gate electrode between the transistors Tr1 and Tr2.

With the layout described above, the gate electrode length connecting the transistors Tr1 and Tr2 will be shortest, and thus the gate input capacitance can be reduced. In this way, high-speed operation and low power consumption of the dynamic circuit are attained. Also, by providing the input terminal IN somewhere between the transistors Tr1 and Tr2, the gate electrode length from the input terminal IN can be minimized for both the transistors Tr1 and Tr2. A transistor operates faster as the distance from the input terminal to the transistor is shorter. Therefore, the dynamic circuit will operate faster with the layout described above.

(Applications of the Present Invention)

Figure 13:
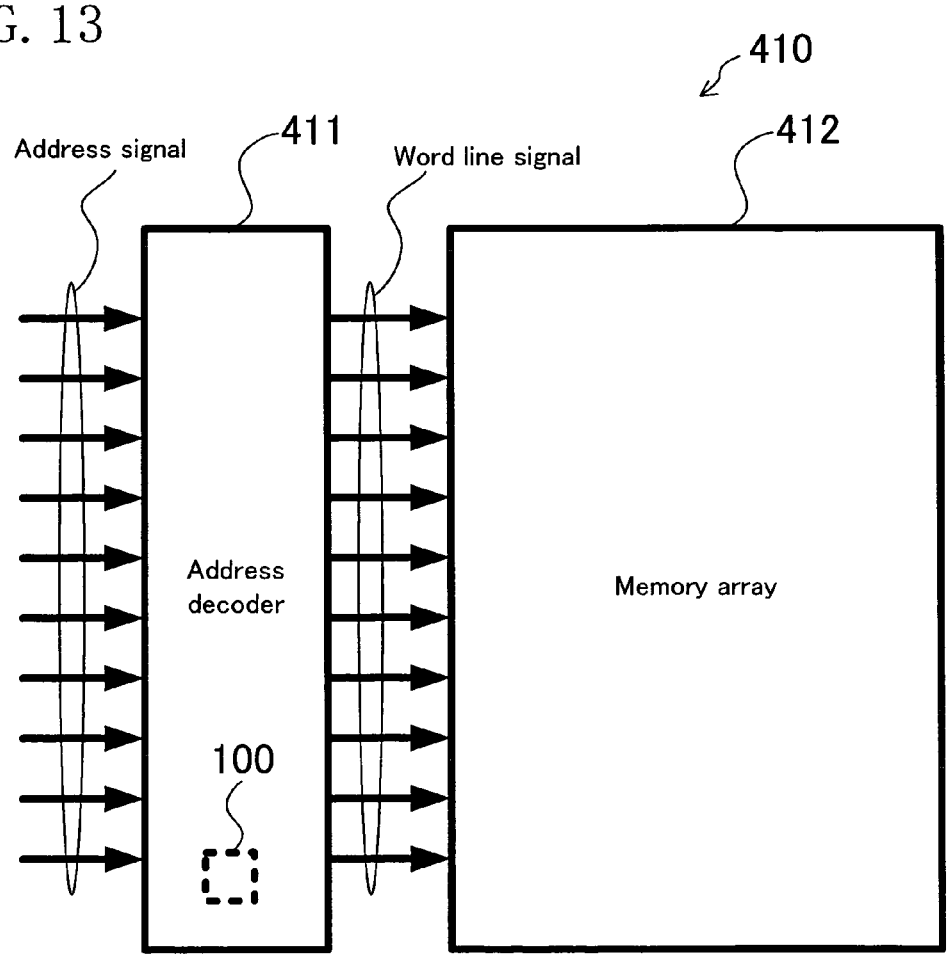
FIG. 13 is a block diagram of a semiconductor memory provided with the dynamic circuit of the present invention.

Some examples of applications of the dynamic circuit of the present invention will be described. FIG. 13 shows a configuration of a semiconductor memory provided with the dynamic circuits of the present invention. A semiconductor memory 410 includes an address decoder 411 and a memory array 412. The address decoder 411 includes a dynamic circuit 100 of the present invention as the minimum logic structure.

In the semiconductor memory 410, the address decoder 411, which performs logic operation for address signals, will need multi-input AND logic when the address space, that is, the address bit width is large, in particular. This will increase the number of stages of transistors connected in series, and thus as semiconductors become finer, it will become difficult to implement such logic operation. However, by using the dynamic circuit of FIG. 10, for example, multi-input AND logic can be implemented with transistors connected in parallel. Thus, logic operation can be easily implemented even when the address bit width is large.

Figure 14:
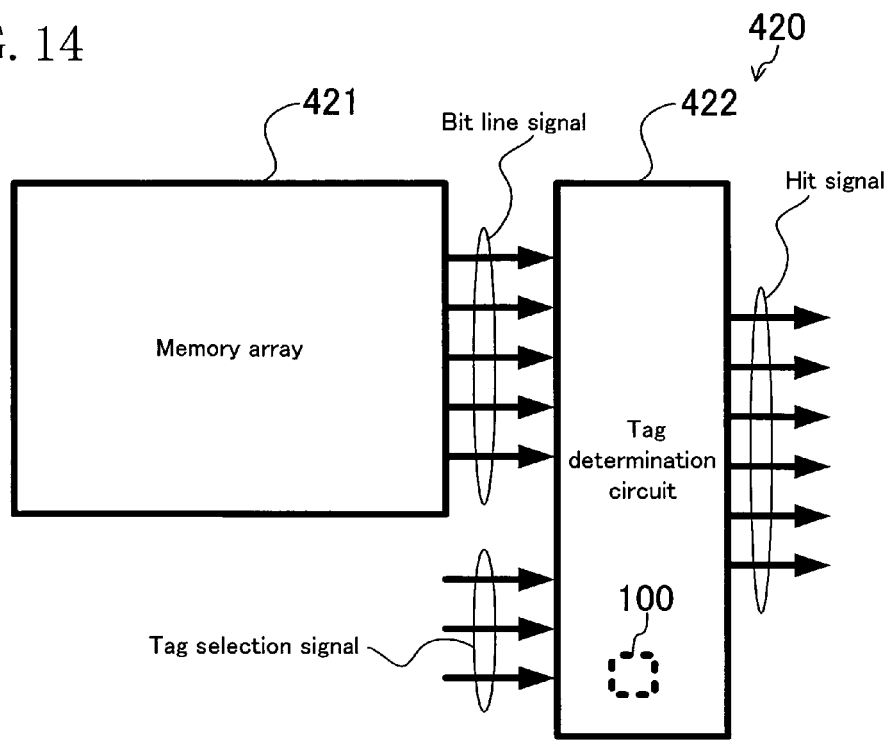
FIG. 14 is a block diagram of a cache memory provided with the dynamic circuit of the present invention.

FIG. 14 shows a configuration of a cache memory provided with the dynamic circuits of the present invention. A cache memory 420 includes a memory array 421 and a tag determination circuit 422. The tag determination circuit 422 includes a dynamic circuit 100 of the present invention as the minimum logic structure.

In the cache memory 420, the tag determination circuit 422 performs tag selection and coincidence determination based on bit line signals. When the tag is large, in particular, multi-input AND logic will be necessary for the tag selection and the coincidence determination. This will increase the number of stages of transistors connected in series, and thus as semiconductors become finer, it will become difficult to implement logic operation. However, by using the dynamic circuit of FIG. 10, for example, multi-input AND logic can be implemented with transistors connected in parallel. Thus, logic operation in the tag selection and the coincidence determination can be easily implemented even when the tag is large.

Figure 15:
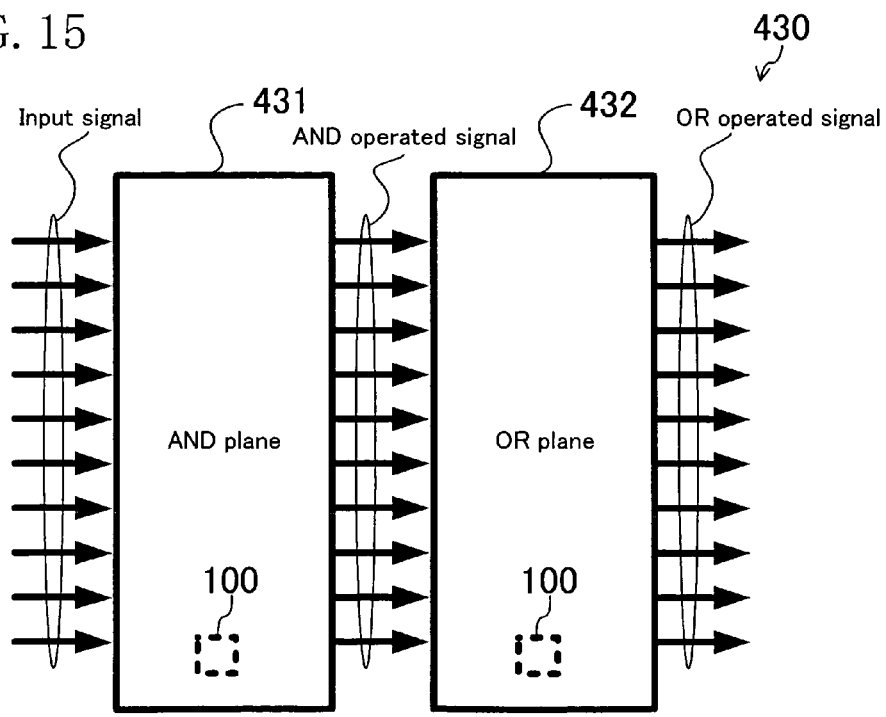
FIG. 15 is a block diagram of a PLA provided with the dynamic circuit of the present invention.

FIG. 15 shows a configuration of a programmable logic array (PLA) provided with the dynamic circuits of the present invention. A PLA 430 includes an AND plane 431 and an OR plane 432. The AND plane 431 and the OR plane 432 respectively include a dynamic circuit 100 of the present invention as the minimum logic structure. Note that at least either the AND plane 431 or the OR plane 432 may include the dynamic circuit 100.

In the PLA 430, the AND plane 431 and the OR plane 432, both requiring logic construction, will need multi-input AND logic when there are many input signals, in particular. In the PLA, AND logic can be implemented with parallel connection of transistors by adopting the inverted logic structure. However, having the timing constraint as described above, speedup will be restricted due to clock skew. Also, since an evaluation control transistor is necessary, the number of stages of transistors connected in series will increase, and thus as semiconductors become finer, it will become difficult to implement such logic. However, by using the dynamic circuit of FIG. 10, for example, multi-input AND logic can be implemented with transistors connected in parallel. Thus, the problem of speedup being restricted due to the timing constraint and the problem of the number of stacks increasing with finer semiconductors can be solved.

Figure 16:
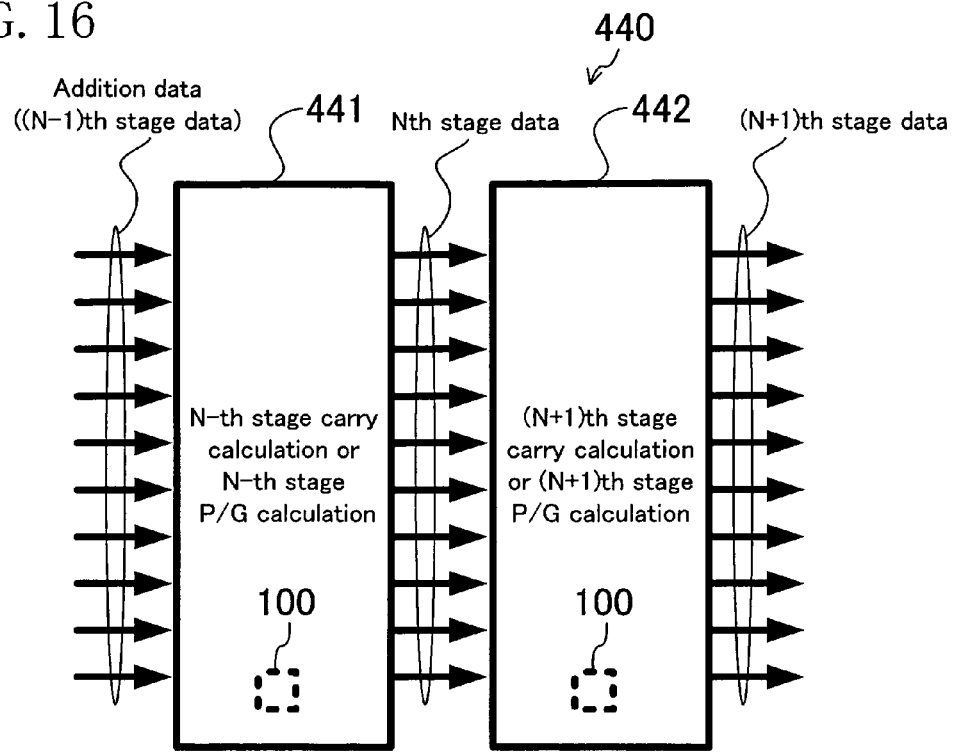
FIG. 16 is a block diagram of an adder provided with the dynamic circuit of the present invention.

FIG. 16 shows a configuration of an adder provided with the dynamic circuits of the present invention. An adder 440 includes a block 441 for N-th (N: natural number) stage carry calculation or P/G calculation and a block 442 for (N+1)th stage carry calculation or P/G calculation. The blocks 441 and 442 respectively include a dynamic circuit 100 of the present invention as the minimum logic structure. Note that at least either one of the blocks 441 and 442 may include the dynamic circuit 100.

In the adder 440, the blocks 441 and 442, which perform logic operation for either carry calculation or carry generation (G) and carry propagation (P) for the carry calculation, will need multi-input AND logic when addition of multi-bit data is executed. This will increase the number of stages of transistors connected in series, and thus as semiconductors become finer, it will become difficult to implement such operation. However, by using the dynamic circuit of FIG. 10, for example, multi-input AND logic can be implemented with transistors connected in parallel. Thus, the logic operation in the addition of multi-bit data can be easily implemented.

Figure 17:
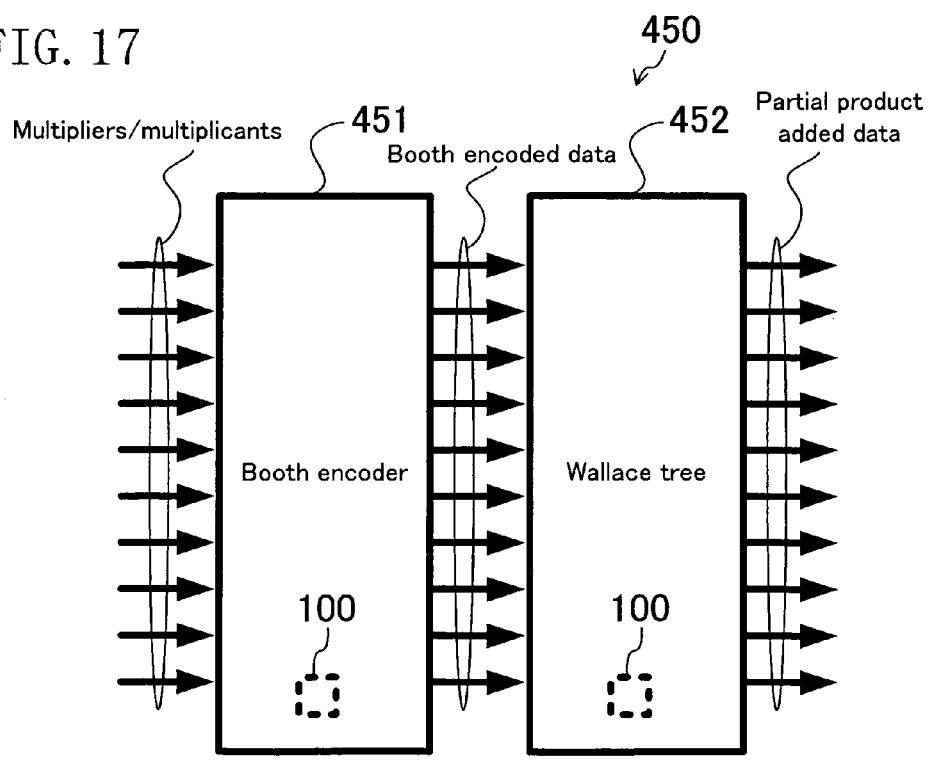
FIG. 17 is a block diagram of a multiplier provided with the dynamic circuit of the present invention.

FIG. 17 shows a configuration of a multiplier provided with the dynamic circuits of the present invention. A multiplier 450 includes a booth encoder 451 and a Wallace tree (partial product addition tree) 452. The booth encoder 451 and the Wallace tree 452 respectively include a dynamic circuit 100 of the present invention as the minimum logic structure. Note that at least either the booth encoder 451 or the Wallace tree 452 may include the dynamic circuit 100.

In the multiplier 450, in which booth encoding and partial product addition logic are required, multi-input AND logic will be necessary when multiplication of multi-bit data is executed. This will increase the number of stages of transistors connected in series, and thus as semiconductors become finer, it will become difficult to implement such logic. However, by using the dynamic circuit of FIG. 10, for example, multi-input AND logic can be implemented with transistors connected in parallel. Thus, the logic operation in the multiplication of multi-bit data can be easily implemented.

Figure 18:
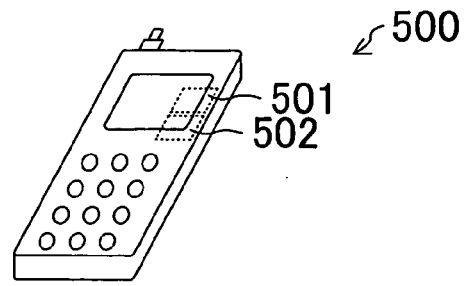
FIG. 18 is an outline of a communication apparatus provided with the dynamic circuit of the present invention.

FIG. 18 shows an outline of a communication apparatus provided with the dynamic circuits of the present invention. A cellular phone 500 as the communication apparatus includes a baseband LS1 501 and an application LSI 502, which are semiconductor integrated circuits having dynamic circuits of the present invention. Since the dynamic circuits of the present invention are operable with power lower than that conventionally required, the baseband LS1 501 and the application LSI 502, as well as the cellular phone 500 having these components, can be operated with low power. As for semiconductor integrated circuits of the cellular phone 500 other than the baseband LS1 501 and the application LSI 502, also, the dynamic circuits of the present invention may be used as logic circuits included in such semiconductor integrated circuits, so that substantially the same effect as that described above can be obtained.

The communication apparatus provided with the dynamic circuits of the present invention should not be limited to the cellular phone, but transmitters/receivers in communication systems, modem units for performing data transmission and the like, for example, may also be included. In other words, according to the present invention, the effect of reducing power consumption can be given to all types of communication apparatuses irrespective of wired or wireless, optical communication or telecommunication, and digital or analog.

Figure 19:
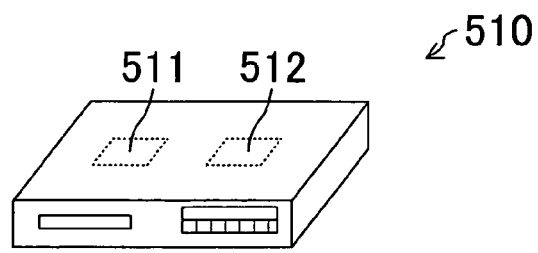
FIG. 19 is an outline of an information playback apparatus provided with the dynamic circuit of the present invention.

FIG. 19 shows an outline of an information playback apparatus provided with the dynamic circuits of the present invention. An optical disk unit 510 as the information playback apparatus includes a media signal processing LSI 511 for processing a signal read from an optical disk and an error/servo processing LSI 512 for performing error correction of the read signal and servo control of an optical pickup. The media signal processing LSI 511 and the error/servo processing LSI 512 are semiconductor integrated circuits having dynamic circuits of the present invention. Since the dynamic circuits of the present invention are operable with power lower than that conventionally required, the media signal processing LSI 511 and the error/servo processing LSI 512, as well as the optical disk unit 510 having these components, can be operated with low power. As for semiconductor integrated circuits of the optical disk unit 510 other than the media signal 20 processing LSI 511 and the error/servo processing LSI 512, also, the dynamic circuits of the present invention may be used as logic circuits included in such semiconductor integrated circuits, so that substantially the same effect as that described above can be obtained.

The information playback apparatus provided with the dynamic circuits of the present invention should not be limited to the optical disk unit, but a magnetic disk-embedded image recording/playback apparatus, an information recording/playback apparatus using a semiconductor memory as a medium, and the like, for example, may also be included. In other words, according to the present invention, the effect of reducing power consumption can be provided to all types of information playback apparatuses (that may have the information recording function) irrespective of the medium on which information is recorded.

Figure 20:
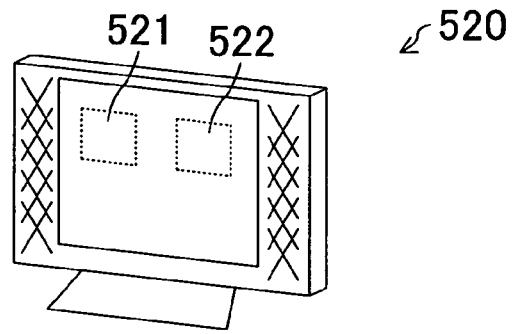
FIG. 20 is an outline of an image display apparatus provided with the dynamic circuit of the present invention.

FIG. 20 shows an outline of an image display apparatus provided with the dynamic circuits of the present invention. A TV receiver 520 as the image display apparatus includes an AV processing LSI 521 for processing an audio signal and a video signal and a display/sound source control LSI 522 for controlling devices such as a display screen and a speaker. The AV processing LSI 521 and the display/sound source control LSI 522 are semiconductor integrated circuits having dynamic circuits of the present invention. Since the dynamic circuits of the present invention are operable with power lower than that conventionally required, the AV processing LSI 521 and the display/sound source control LSI 522, as well as the TV receiver 520 having these components, can be operated with low power. As for semiconductor integrated circuits of the TV receiver 520 other than the AV processing LSI 521 and the display/sound source control LSI 522, also, the dynamic circuits of the present invention may be used as logic circuits included in such semiconductor integrated circuits, so that substantially the same effect as that described above can be obtained.

The image display apparatus provided with the dynamic circuits of the present invention should not be limited to the TV receiver, but an apparatus for displaying streaming data distributed via a telecommunication line, for example, may also be included. In other words, according to the present invention, the effect of reducing power consumption can be provided to all types of image display apparatuses irrespective of the information transmission method.

Figure 21:
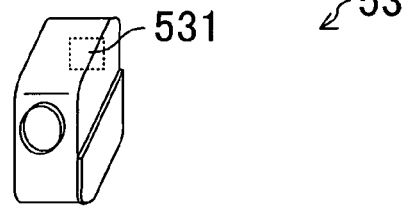
FIG. 21 is an outline of an electronic apparatus provided with the dynamic circuit of the present invention.

FIG. 21 shows an outline of an electronic apparatus provided with the dynamic circuits of the present invention. A digital camera 530 as the electronic apparatus includes a signal processing LSI 531 as a semiconductor integrated circuit having dynamic circuits of the present invention. Since the dynamic circuits of the present invention are operable with power lower than that conventionally required, the signal processing LSI 531, as well as the digital camera 530 having this component, can be operated with low power. As for semiconductor integrated circuits of the digital camera 530 other than the signal processing LSI 531, also, the dynamic circuits of the present invention may be used as logic circuits included in such semiconductor integrated circuits, so that substantially the same effect as that described above can be obtained.

The electronic apparatus provided with the dynamic circuits of the present invention should not be limited to the digital camera, but apparatuses having semiconductor integrated circuits as a whole, such as various types of sensors and electronic calculators, for example, may also be included. According to the present invention, the effect of reducing power consumption can be provided to electronic apparatuses as a whole.

Figure 22:
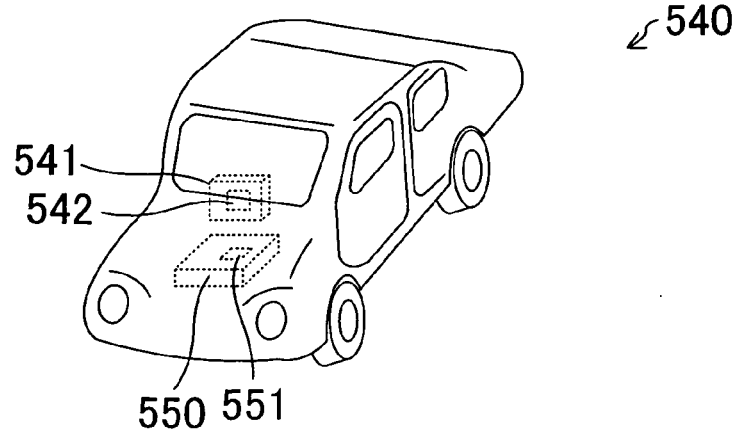
FIG. 22 is an outline of an electronic control apparatus provided with the dynamic circuit of the present invention and a mobile unit provided with the electronic control apparatus.

FIG. 22 shows an outline of an electronic control unit provided with the dynamic circuits of the present invention and a mobile unit having such an electronic control unit. A car 540 as the mobile unit includes an electronic control unit 550. The electronic control unit 550 includes an engine/transmission control LSI 551 that is a semiconductor integrated circuit having dynamic circuits of the present invention and controls the engine, transmission and the like of the car 540. The car 540 also includes a navigation unit 541.

Like the electronic control unit 550, the navigation unit 541 includes a navigation LSI 542 that is a semiconductor integrated circuit having dynamic circuits of the present invention.

Since the dynamic circuits of the present invention are operable with power lower than that conventionally required, the engine/transmission control LSI 551, as well as the electronic control unit 550 having this component, can be operated with low power. Likewise, the navigation LSI 542, as well as the navigation unit 541 having this component, can be operated with low power. As for semiconductor integrated circuits of the electronic control unit 550 other than the engine/transmission control LSI 551, also, the dynamic circuits of the present invention may be used as logic circuits included in such semiconductor integrated circuits, so that substantially the same effect as that described above can be obtained. This also applies to the navigation unit 541. With the reduction in the power consumption of the electronic control unit 550, the power consumption of the car 540 can also be reduced.

The electronic control unit provided with the dynamic circuits of the present invention should not be limited to that for controlling the engine and the transmission as described above, but apparatuses that have semiconductor integrated circuits and control the power source as a whole, such as a motor control unit, for example, may also be included. According to the present invention, the effect of reducing power consumption can be provided to such electronic control units.

Likewise, the mobile unit provided with the dynamic circuits of the present invention should not be limited to the car, but those having an electronic control unit for controlling the engine, the motor and the like as the power source, such as trains and airplanes, for example, may also be included. According to the present invention, the effect of reducing power consumption can be provided to such mobile units.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A dynamic circuit comprising:
   a chargeable dynamic node;
   an evaluation circuit for performing logic evaluation for a plurality of input signals and discharging the dynamic node based on an evaluation result;
   a control circuit having a replica circuit of a part of the evaluation circuit or the same of the evaluation circuit and outputting a first control signal of which the logic level changes according to a result of logic evaluation for a part of the plurality of input signals or all of the plurality of input signals performed by the replica circuit; and
   an initialization circuit for receiving the first control signal from the control circuit and a second control signal from outside, and starting precharge of the dynamic node if the second control signal shifts from a first logic level to a second logic level and stopping the precharge of the dynamic node if the first control signal shifts from a first logic level to a second logic level,
   wherein the evaluation circuit is directly connected to the chargeable dynamic node.

2. The dynamic circuit of claim 1, wherein the replica circuit has the same logic structure and input as the entire of the evaluation circuit.

3. The dynamic circuit of claim 1, wherein the initialization circuit comprises:
   a first switch circuit connected to either one of a node for supplying an initializing voltage for the dynamic node and the dynamic node at one terminal, the first switch circuit being turned ON if the second control signal shifts to its second logic level; and a second switch circuit connected to the other terminal of the first switch circuit at one terminal and to the other of the two nodes at the other terminal, the second switch circuit being turned OFF if the first control signal shifts to its second logic level.

4. The dynamic circuit of claim 1, wherein the initialization circuit comprises:

a logic operation circuit for receiving the first and second control signals and performing logic operation for these signals; and a switch circuit connected to a node for supplying an initializing voltage for the dynamic node at one terminal and to the dynamic node at the other terminal, the switch circuit switching between ON/OFF of electrical connection between these nodes according to an output of the logic operation circuit.

5. The dynamic circuit of claim 1, wherein the control circuit receives the second control signal, and sets the first control signal at its second logic level if the second control signal is in its second logic level and the result of logic evaluation performed by the replica circuit is truth, and otherwise sets the first control signal at its first logic level.

6. The dynamic circuit of claim 5, wherein the control circuit comprises:

a first switch circuit connected to a voltage node corresponding to the second logic level of the first control signal at one terminal and to one terminal of the replica circuit at the other terminal, the first switch circuit receiving the second control signal and being turned ON if the second control signal shifts to its second logic level; and a second switch circuit connected to a voltage node corresponding to the first logic level of the first control signal at one terminal and to an output node of the first control signal, the second switch circuit receiving the second control signal and being turned ON if the second control signal shifts to its first logic level, and the other terminal of the replica circuit is connected to the output node of the first control signal.

7. The dynamic circuit of claim 1, wherein the control circuit receives the second control signal and a voltage of the dynamic node, and sets the first control signal at its second logic level if the second control signal is in its second logic level and either the result of logic evaluation performed by the replica circuit is truth or the voltage of the dynamic node is equal to or higher than a predetermined level, and otherwise sets the first control signal at its first logic level.

8. The dynamic circuit of claim 7, wherein the control circuit comprises:

a first switch circuit connected to a voltage node corresponding to the second logic level of the first control signal at one terminal and to one terminal of the replica circuit at the other terminal, the first switch circuit receiving the second control signal and being turned ON if the second control signal shifts to its second logic level;

a second switch circuit connected to either one of a voltage node corresponding to the first logic level of the first control signal and an output node of the first control signal at one terminal, the second switch circuit receiving the second control signal and being turned ON if the second control signal shifts to its first logic level;

a third switch circuit connected to the other terminal of the second switch circuit and to the other of the voltage node corresponding to the first logic level of the first control signal and the output node of the first control signal at the other terminal, the third switch circuit being ON until the voltage of the dynamic node reaches the predetermined level; and a fourth switch circuit connected in parallel with at least the replica circuit and turned ON once the voltage of the dynamic node reaches the predetermined level, and the other terminal of the replica circuit is connected to the output node of the first control signal.

9. The dynamic circuit of claim 1, further comprising a constant current source connected in series with the evaluation circuit.

10. The dynamic circuit of claim 1, wherein transistors constituting the replica circuit and transistors constituting the corresponding at least part of the evaluation circuit are configured in pairs, and signal input terminals of the replica circuit and the corresponding at least part of the evaluation circuit are placed between the respective paired transistors.

11. The dynamic circuit of claim 1, wherein the evaluation circuit has a plurality of transistors respectively provided for the plurality of input signals for switching between ON/OFF according to the corresponding input signals, and the plurality of transistors are connected in parallel.

12. The dynamic circuit of claim 1, wherein the evaluation circuit has a plurality of transistors respectively provided for the plurality of input signals for switching between ON/OFF according to the corresponding input signals, and the plurality of transistors are connected in parallel.

13. A semiconductor memory comprising an address decoder and a memory array, wherein the address decoder has a logic operation circuit comprising the dynamic circuit of claim 1.

14. A cache memory comprising a memory array and a tag determination circuit, wherein the tag determination circuit has a logic operation circuit comprising the dynamic circuit of claim 1.

15. A PLA comprising an AND plane circuit and an OR plane circuit, wherein at least one of the AND plane circuit and the OR plane circuit has a logic operation circuit comprising the dynamic circuit of claim 1.

16. An adder comprising a carry calculation circuit, a carry generation circuit and a carry propagation circuit, wherein at least one of the carry calculation circuit, the carry generation circuit and the carry propagation circuit has a logic operation circuit comprising the dynamic circuit of claim 1.

17. A multiplier comprising a booth encoder and a partial product addition tree, wherein at least one of the booth encoder and the partial product addition tree has a logic operation circuit comprising the dynamic circuit of claim 1.

18. A communication apparatus comprising a semiconductor integrated circuit having the dynamic circuit of claim 1.

19. An information playback apparatus comprising a semiconductor integrated circuit having the dynamic circuit of claim 1.

20. An image display apparatus comprising a semiconductor integrated circuit having the dynamic circuit of claim 1.

21. An electronic apparatus comprising a semiconductor integrated circuit circuit the dynamic circuit of claim 1.

22. An electronic control apparatus comprising a semiconductor integrated circuit having the dynamic circuit of claim 1.

23. A mobile unit comprising the electronic control apparatus of claim 22.

24. The dynamic circuit of claim 1, wherein
the replica circuit includes the same of the evaluation circuit.

25. A method for initializing a dynamic circuit, comprising the steps of:
   starting precharge of a dynamic node under a predetermined condition;
   discharging the dynamic node directly based on an evaluation result for a plurality of input signals;
   performing logic evaluation for a part of the plurality of input signals or all of the plurality of input signals; and
   stopping the precharge of the dynamic node if a result of the logic evaluation is true.

26. The method of claim 25, wherein the precharge of the dynamic node is continued until the voltage of the dynamic node reaches a predetermined level if the result of the logic evaluation is false, and is stopped once the voltage of the dynamic node reaches the predetermined level.

\* \* \* \* \*